(12) United States Patent
Bourque

(10) Patent No.: US 12,311,835 B2
(45) Date of Patent: May 27, 2025

(54) REAR WINDOW-MOUNTED DOUBLE-SIDED DISPLAY FOR EMERGENCY VEHICLE USE

(71) Applicant: Richard Bourque, San Jose, CA (US)

(72) Inventor: Richard Bourque, San Jose, CA (US)

( * ) Notice: Subject to any disclaimer, the term of this patent is extended or adjusted under 35 U.S.C. 154(b) by 173 days.

(21) Appl. No.: 18/208,045

(22) Filed: Jun. 9, 2023

(65) Prior Publication Data
US 2024/0409026 A1    Dec. 12, 2024

(51) Int. Cl.
| | |
|---|---|
| *B60Q 1/00* | (2006.01) |
| *B60Q 1/50* | (2006.01) |
| *B60R 1/26* | (2022.01) |
| *G06T 11/60* | (2006.01) |
| *G06T 13/00* | (2011.01) |
| *H04N 7/18* | (2006.01) |
| *H05K 5/02* | (2006.01) |
| *H04N 23/54* | (2023.01) |

(52) U.S. Cl.
CPC .............. *B60Q 1/5035* (2022.05); *B60R 1/26* (2022.01); *G06T 11/60* (2013.01); *G06T 13/00* (2013.01); *H04N 7/183* (2013.01); *H05K 5/0217* (2013.01); *H04N 23/54* (2023.01)

(58) Field of Classification Search
CPC ......... B60Q 1/5035; B60R 1/26; G06T 11/60; G06T 13/00
See application file for complete search history.

(56) References Cited

U.S. PATENT DOCUMENTS

| | | | | |
|---|---|---|---|---|
| 11,012,666 | B2 * | 5/2021 | Park ........................ | G06V 20/56 |
| 2004/0226204 | A1 * | 11/2004 | Green ..................... | G09F 21/04 |
| | | | | 40/446 |
| 2015/0043231 | A1 * | 2/2015 | Clark ...................... | F21S 43/00 |
| | | | | 362/485 |
| 2018/0147989 | A1 * | 5/2018 | Kelleher .................. | B60R 1/26 |
| 2020/0001781 | A1 * | 1/2020 | Sanders ................... | B60Q 1/50 |
| 2021/0188322 | A1 * | 6/2021 | Yoshida .................. | G01C 21/34 |
| 2022/0396148 | A1 * | 12/2022 | Rodrigues .............. | B60K 35/00 |

OTHER PUBLICATIONS

Liu, Jun, "Protecting Roadside Workers: Field Evaluation of a Vehicle-Mounted Variable Message Sign and Examination of Worker Perceptions and Use of Countermeasures", Jan. 2023, AAA Foundation for Traffic Safety, pp. 1-120 (Year: 2023).*

* cited by examiner

*Primary Examiner* — Terrell M Robinson

(57) ABSTRACT

Embodiments of the present invention provide electronic display devices capable of displaying information that is observable to the public (e.g., other motorists and pedestrians) without substantially impacting the visibility of the driver. Embodiments include a display panel facing out from the vehicle that is visible from the exterior, and a display device pointing to the inside of the vehicle that reproduces the scene behind the vehicle in a way that is visible to occupants (e.g., the driver). The electronic display devices can be mounted inside the rear window of an emergency response vehicle using mounts that orient the display substantially perpendicular to the road, for example.

20 Claims, 12 Drawing Sheets

REAR WINDOW-MOUNTED DOUBLE-SIDED DISPLAY FOR EMERGENCY VEHICLE USE

FIELD

Embodiments of the present invention generally relate to the field of electronic display systems. More specifically, embodiments relate to electronic display devices for use in motor vehicles.

BACKGROUND

A common cause of vehicular accidents involves a lack of effective communication between motorists. This is especially true in the case of emergency response vehicles (e.g., police, fire, ambulance, etc.), where the driver of the emergency vehicle is often aware of traffic conditions or road hazards that may be unknown to other drivers on the road. The safety of the emergency vehicle and other motorists is improved by informing them of these conditions. As such, many modern emergency response vehicles are equipped with public address (PA) systems and flashing lights that can be activated as a warning to other drivers. However, PA systems are often unable to address drivers inside of vehicles due to road noise, vehicle soundproofing, in-car entertainment systems, etc., and moreover flashing lights are unable to convey specific information that can be used to improve the safety of other drivers.

Accordingly, some emergency vehicles are equipped with electronic display devices that are visible from outside of the vehicle and that can be used to communicate with pedestrians and other motorists. The conventional display devices may be obscured when mounted on an exterior panel of the vehicle (e.g., door, fender, hood, etc.) and typically provides insufficient visibility to communicate with other drivers. When the display devices are mounted relatively high on the vehicle, such as on or inside of a window or windshield, for example, the display device disadvantageously blocks the visibility of the driver of the emergency vehicle, which is a significant safety concern. An improved approach to electronic display-based public communication systems for emergency response and other vehicles is desired.

SUMMARY

Embodiments of the present invention provide vehicle-mounted electronic display devices capable of displaying information that is observable to the public (e.g., other motorists and pedestrians) without substantially impacting the visibility of the driver. Embodiments include a display panel facing out from the vehicle (e.g., rear window mounted) that is visible from the exterior, and a display panel pointing to the inside of the vehicle that reproduces the scene behind the vehicle in a way that is visible to occupants (e.g., the driver). The electronic display device with the dual panels can be mounted inside the rear window of an emergency response vehicle using mounts that orient the display substantially perpendicular to the road, for example. A rear mounted camera can provide images to the forward-facing panel while emergency messages can be displayed on the rear-facing panel.

According to one disclosed embodiment, a dual-sided display device for emergency vehicle communication is disclosed. The display device includes a first display panel operable to display public notifications and operable to be disposed adjacent to a rear window of an emergency vehicle where the first display panel is operable to display images viewable to traffic behind the emergency vehicle, a camera disposed on the first display panel and operable to capture real-time rear-view video of the emergency vehicle, and a second display panel, disposed adjacent to the first display panel, and coupled to the camera, the second display panel operable to display the rear-view video viewable to a driver of the emergency vehicle. The first and second display panels are disposed back-to-back and in parallel with each other.

According to some embodiments, the second display panel is forward facing and is operable to be viewed from inside the emergency vehicle.

According to some embodiments, the first display panel is rear-facing.

According to some embodiments, the dual-sided display device includes an input device operable to receive input including at least one of: text input, and message selection input, and the first display panel is operable to display public notifications based on the input.

According to some embodiments, the dual-sided display device includes a processor and a memory. The memory stores a plurality of messages for display on the first display panel, and the processor is operable to access a selected message of the plurality of messages for display on the first display panel.

According to some embodiments, the dual-sided display device includes a top mounting element disposed near a top edge of the first display panel and a bottom mounting element disposed near a bottom edge of the first display panel. The top mounting element and the bottom mounting element are operable to fix the first display panel and the second display panel to an interior surface of the rear window of the emergency vehicle.

According to some embodiments, the top mounting element and the bottom mounting element are selectively adjustable in length to change an orientation angle of the first display panel and the second display panel.

According to a different embodiment, an emergency vehicle display assembly is disclosed. The emergency vehicle display assembly includes a first display panel operable to display public notifications and operable to be disposed adjacent to a rear window of an emergency vehicle where, so disposed, the first display panel is operable to display images viewable to traffic behind the emergency vehicle, a camera disposed on the first panel and operable to capture real-time rear view scene video of the emergency vehicle, a second display panel, disposed adjacent to the first display panel, and coupled to the camera, the second display panel operable to display the rear view scene video, and a processor coupled to the first display panel and operable to receive information from an input device and operable to generate the public notifications based on the information, the input device coupled to the processor and operable to receive input including at least one of: text input, and message selection input, and mounting elements disposed on the first display panel, the mounting elements operable to secure the first and second display panels within the emergency vehicle and on to the rear window thereof.

According to some embodiments, the second display panel is forward facing and operable to be viewed from inside the emergency vehicle. The first display panel is rear-facing.

According to some embodiments, the first and second display panels are disposed back-to-back and in parallel with each other.

According to some embodiments, the display assembly includes a memory coupled to the processor. The memory is operable to store a plurality of messages for display on the first display device. The processor is operable to select a first message of the plurality of messages according to the message selection input received by the input device.

According to some embodiments, the input device is further operable to receive at least one of: color value information, and animation value information. The processor is further operable to generate the public information according to at least one of: the color value information, and animation value information.

According to a different embodiment, a method of displaying public information on a vehicle-mounted display of an emergency vehicle, the method including capturing real-time rear-view scene video using a camera mounted near a rear of the vehicle, displaying the real-time rear-view scene video on an interior-facing display device mounted to a rear window of the vehicle, where the interior-facing display device is visible from the inside of the emergency vehicle, receiving message data from a computer system disposed in the vehicle, and displaying a public information message on an exterior-facing display device based on the message data. The exterior-facing display device is visible from outside of the emergency vehicle, and the interior-facing display device and the exterior-facing display device are disposed back-to-back and in parallel with each other.

According to some embodiments, the interior-facing display device and the exterior-facing display device are mounted adjacent to a rear window of the emergency vehicle.

According to some embodiments, the receiving message data from a computer system disposed in the vehicle includes receiving input data from an input device coupled to the computer system.

According to some embodiments, the input data includes text.

According to some embodiments, the method includes receiving via the input device, at least one of: color value information, and animation value information. The processor is further operable to generate the public information according to at least one of: the color value information, and the animation value information.

According to some embodiments, the method includes storing a plurality of messages for display on the display device in a memory of the computer system, and the displaying a public information message on an exterior-facing display device is based on a message selection input received by the input device that identifies one of the plurality of messages.

According to some embodiments, the method includes displaying the public information message on an in-vehicle display.

According to some embodiments, the public information message includes animated text.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, components, and circuits have not been described in detail as not to unnecessarily obscure aspects and features of the subject matter.

Figure 5:
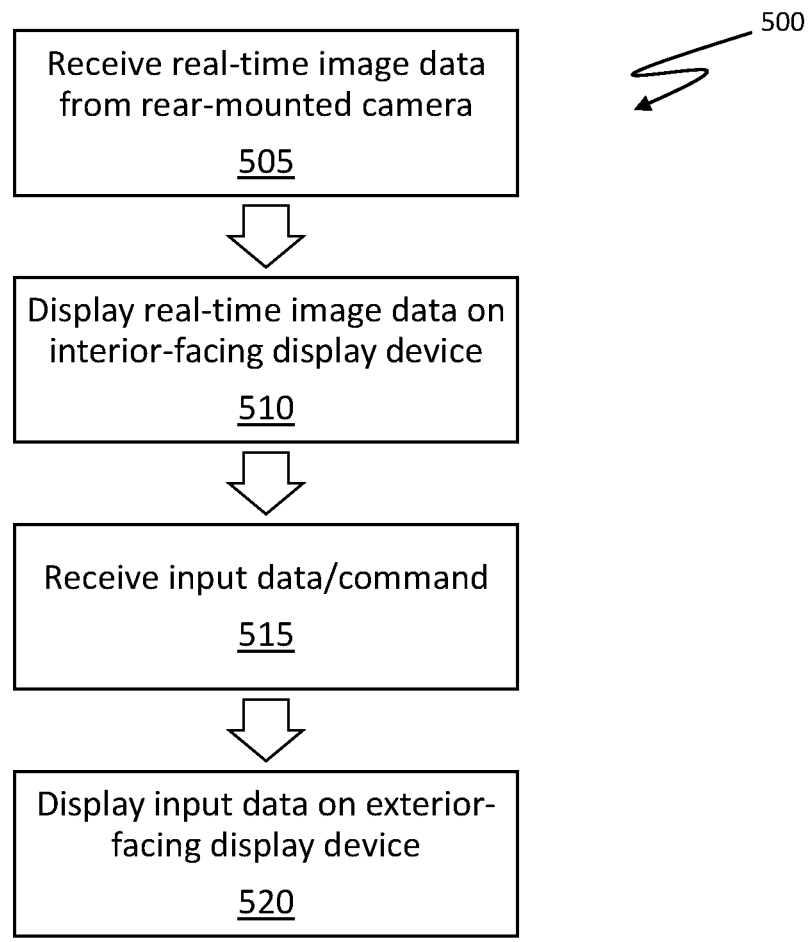
FIG. 5 is a flowchart depicting exemplary steps of a process for real-time communication with other drivers and visibility enhancement according to embodiments of the present invention.

Portions of the detailed description that follows are presented and discussed in terms of a method (e.g., FIG. 5). Although steps and sequencing thereof are disclosed in a figure herein describing the operations of this method, such steps and sequencing are exemplary. Embodiments are well suited to performing various other steps or variations of the steps recited in the flowchart of the figure herein, and in a sequence other than that depicted and described herein.

Some portions of the detailed description are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer-executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout, discussions utilizing terms such as "accessing," "writing," "including," "storing," "transmitting," "traversing," "associating," "identifying," "updating," "determining," "selecting," "animating," "displaying," "lighting" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Rear Window-Mounted Double-Sided Display for Signaling and Communication with Visibility Enhancement Embodiments of the present invention provide vehicle-mounted electronic display devices capable of displaying information that is observable to the public (e.g., other motorists and pedestrians) without substantially impacting the visibility of the driver. Embodiments include a first display panel facing out and rear from the vehicle that is visible from the exterior, and a second display panel pointing to the inside of the vehicle that reproduces the scene behind the vehicle in a way that is visible to occupants (e.g., the driver). The electronic display panels can be disposed adjacent to each other with the resulting dual-sided assembly. can be mounted inside the rear window of an emergency response vehicle using mounts that orient the display substantially perpendicular to the road, for example.

The exterior-facing display device or panel typically displays information intended to be communicated to other drivers, pedestrians, etc., and is oriented to be viewed from behind the vehicle, while the interior-facing display device or panel typically acts as a "pass-through" by displaying a video of the scene behind the emergency response vehicle as captured by a camera fixed to the vehicle and facing behind the vehicle. The interior-facing display panel is oriented to project images forward. By displaying video of the scene behind the vehicle, the electronic display devices can be mounted on or near the rear window of the vehicle without blocking the driver from seeing backwards, e.g., behind the vehicle.

According to some embodiments, the display panels (interior-facing and exterior-facing) are layers of a single display device (a "double-sided" display device). According to other embodiments, the display panels are separate display devices that can share a common frame/bezel and/or mounting apparatus that fixes the forward and backward-facing displays to the vehicle. In yet other embodiments, the display devices are mounted separately, one being mounted to the interior of the vehicle, and one being mounted to the exterior of the vehicle, for example. For example, the display devices can be disposed back-to-back and in parallel with each other. The display devices can be powered by the main vehicle battery and an optional power inverter, or by a separate power source, according to embodiments.

Figure 1:
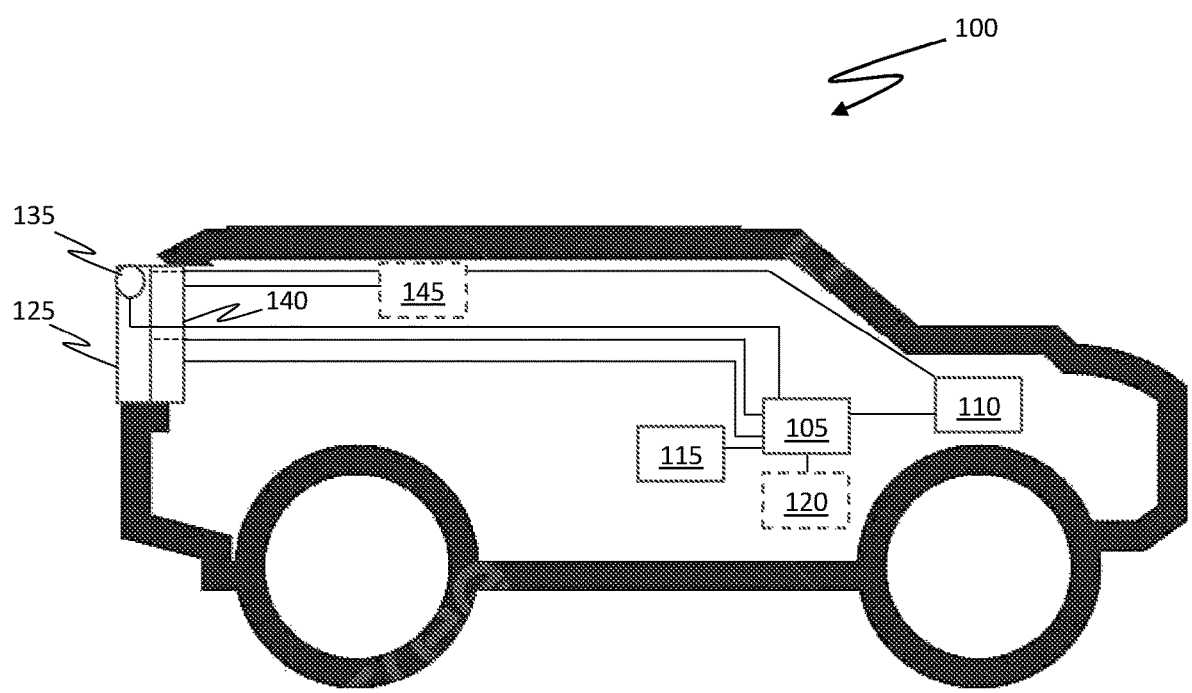
FIG. 1 is a block diagram depicting an exemplary vehicle including an interior-facing display device (panel) and an exterior-facing display device (panel) for communicating with other drivers by displaying messages, symbols, flashing lights, or colors, for instance, according to input received using a computer system of the vehicle according to embodiments of the present invention.

FIG. 1 depicts a side view of an exemplary vehicle 100 including an interior-facing display device 140 and an exterior-facing display device 125 in a dual-sided assembly for communicating with other drivers by displaying messages, symbols, flashing lights, or colors, for instance, according to input received using a computer system of the vehicle according to embodiments of the present invention. Interior-facing display device 140 and an exterior-facing display device 125 are typically disposed inside of the vehicle near the rear of the vehicle, with the interior-facing display device 140 facing the driver, and the exterior-facing display device 125 facing outward so that it is visible to motorists behind vehicle 100.

Interior-facing display device 140 displays real-time video of the scene and objects behind the vehicle (e.g., roads, vehicles, hazards, etc.) as captured in real-time by rear-pointing camera 135, which is typically mounted to the frame or bezel of exterior-facing display device 125. Alternatively, camera 135 can be mounted to the top of the tailgate, rear door, or hatch of the vehicle. It is appreciated that mounting camera 135 relatively high produces better visibility of traffic conditions behind the driver, and mounting the exterior-facing display relatively high allows the display to be viewed better by motorists. In this way, the vehicle computer system 105 can communicate with nearby drivers (e.g., drivers behind the vehicle) without obstructing the rear view of the driver to visualize the scene behind the vehicle in real-time. By communicating effectively without blocking the rear view of the driver, the safety of both the driver and other nearby motorists is significantly improved. Moreover, mounting the camera 135 relatively high near the rear of the vehicle can advantageously provide better visibility compared to merely looking through the rear window.

In the example of FIG. 1, interior-facing display device 140 and exterior-facing display device 125 are disposed back-to-back and are communicatively coupled to computer system 105, which typically includes a processor, memory, and communication ports (e.g., USB ports) for communication with other connected devices. Input device 115 is coupled to computer system 105 to provide input for display on exterior-facing display device 125. For example, input device 115 can receive text input, and the text can be displayed on exterior-facing display device 125. The text can be a scrolling or a static, or can be displayed using other types of animation (e.g., flashing, moving, etc.).

User input device 115 can be used by the driver, for instance, to select colors, flashing lights, preconfigured messages, and animations that can be stored in a memory of computer system 105. The input can include an adjustment to the color, size, or animation speed of a text displayed on exterior-facing display device 125. According to some embodiments, optional in-vehicle display device 120 displays the same information that is displayed on exterior-facing display device 125 as a message preview, and can include a touch-based display for receiving input in addition to or in place of user input device 115. According to some embodiments, user input device 115 and in-vehicle display device 120 are integrated into a single device (e.g., a tablet, smartphone, or laptop).

Advantageously, the data displayed on exterior-facing display device 125 can be used to warn other nearby motorists of important information, such as hazardous conditions ahead, or road closures, construction, detours, lane closure, or other information that may be important to motorists near the vehicle. Moreover, the exterior-facing display device 125 can be used to display information that does not pertain to driver safety, such as advertisements, Amber Alert information, or any other information that the driver wants to share with nearby motorists and pedestrians. The exterior-facing camera messages can also be used for directing traffic.

Vehicle power source (e.g., battery) 110 provides power to computer system 105, interior-facing display device 140, and exterior-facing display device 125, and can be optionally coupled to an inverter 145 for powering the display devices. According to some embodiments, the display devices are coupled to a power source separate from the main vehicle power source, such as a solar panel, battery cell, or the like.

Figure 2:
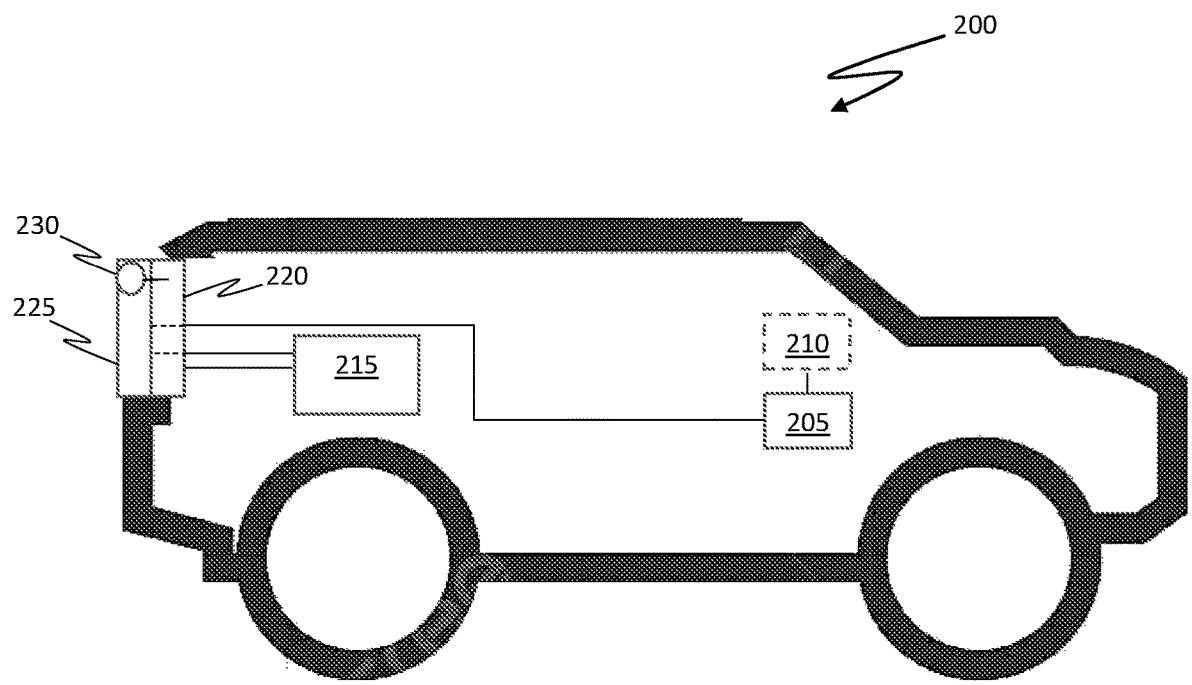
FIG. 2 is a block diagram depicting an exemplary vehicle including an interior-facing display device and an exterior-facing display device using an input device to communicate with other drivers according to embodiments of the present invention.

FIG. 2 depicts an exemplary vehicle 200 including an interior-facing display device 220 and an exterior-facing display device 225 for communicating with other drivers according to embodiments of the present invention. Interior-facing display device 220 displays real-time video of the road and objects behind the vehicle (e.g., other vehicles, lane markings, hazards, etc.) as captured in real-time by rear-pointing camera 230, which is typically mounted near the rear of the vehicle within a frame or bezel of exterior-facing display device 225. In the example of FIG. 2, the camera 230 is integrated into the frame of exterior-facing display device and communicatively coupled to interior-facing display device 220 to display a real-time feed of the camera showing the scene behind the vehicle 200, and thereby simulating a "rear view" of the rear window for the driver.

Exterior-facing display device 225 receives input commands from input device 205 and displays a message corresponding to the input that is visible to motorists behind vehicle 200. Input device 205 can be coupled to exterior-facing display device 225 using a wired or wireless connection, such as Bluetooth, Wi-Fi, etc., for sending messages and commands for display on exterior-facing display device 225. Input device 205 can be coupled to an optional in-vehicle display device 210, which displays the message as displayed on exterior-facing display device 225 as a message preview. Interior-facing display device 220 and exterior-facing display device 225 are coupled to power source 215, which can be the main vehicle battery or a separate power source, according to embodiments.

Figure 3A:
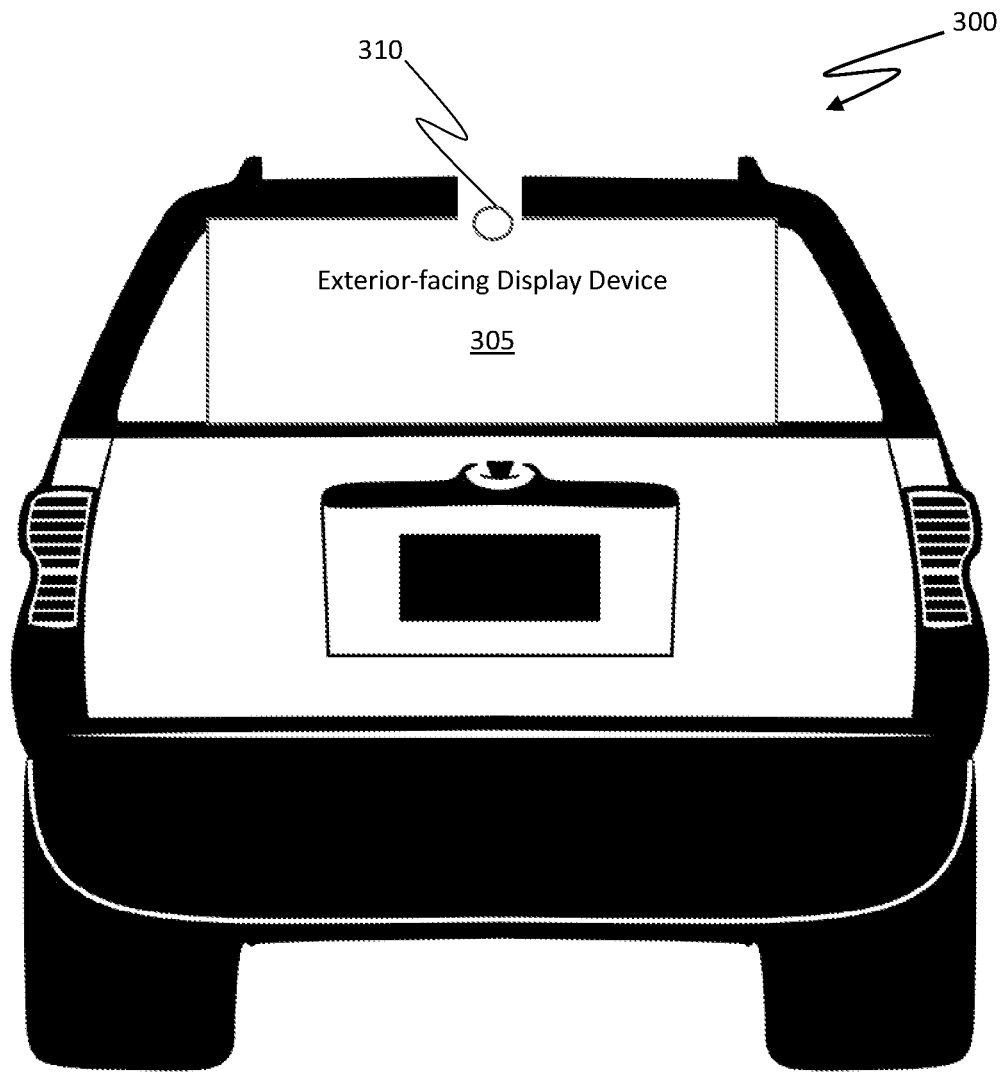
FIG. 3A is a diagram depicting an exemplary vehicle exterior including an exterior-facing display device for displaying messages and a camera that captures the scene behind the vehicle according to embodiments of the present invention.

FIG. 3A depicts an exemplary view of the rear of vehicle 300 including an exterior-facing display device 305 for displaying messages and a camera 310 that captures the scene behind the vehicle 300 according to embodiments of the present invention. Camera 310 can send video data to an interior-facing display device that reproduces the scene behind the vehicle 300 as a simulated real-time rear view to improve the visibility of the driver of vehicle 300. Exterior-facing display is operable to display messages that are visible to other drivers and pedestrians including instructions or warnings to other the drivers regarding road conditions ahead, such as lane closures, accidents, flooding, etc., and can be used for directing traffic.

Figure 3B:
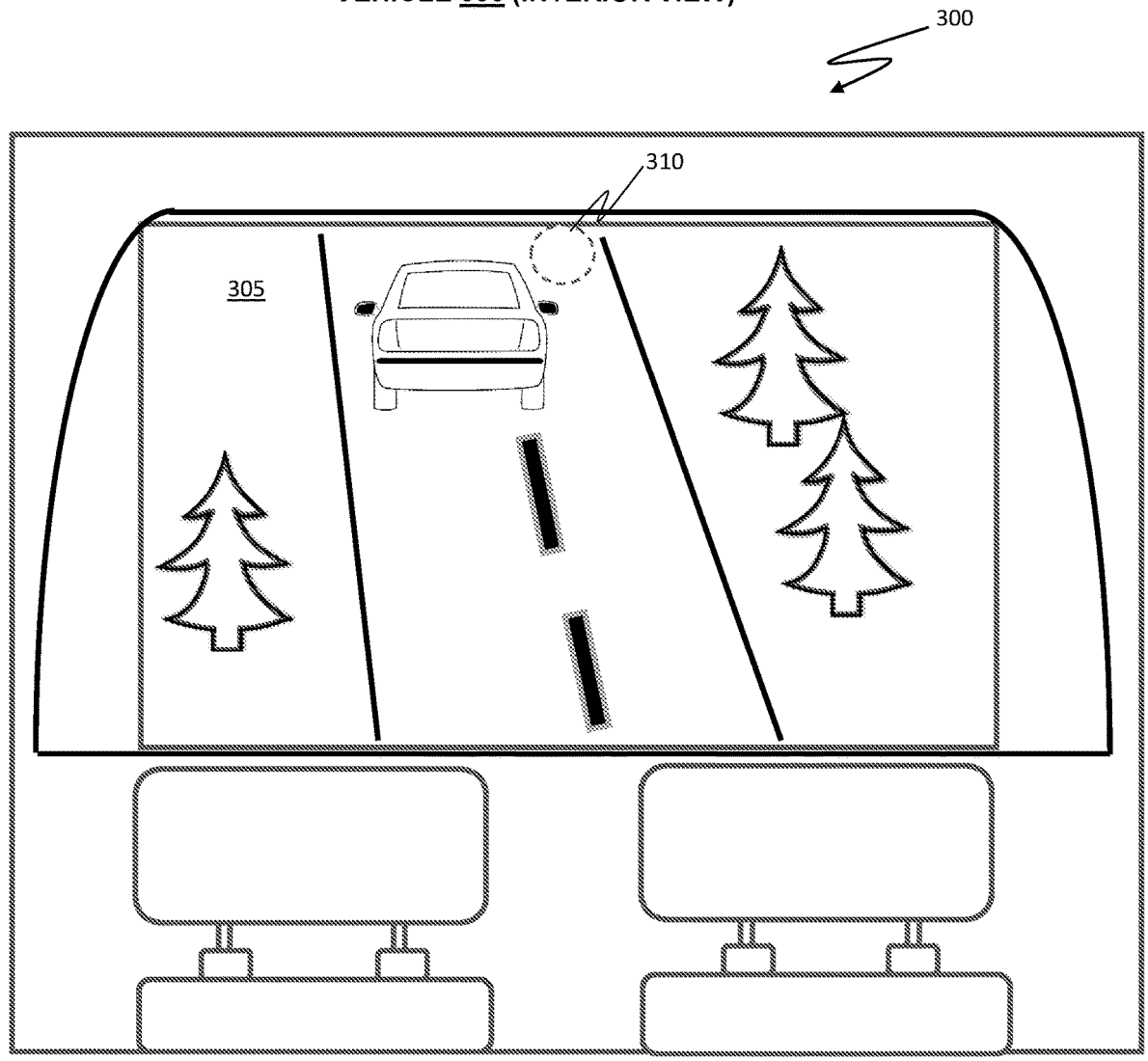
FIG. 3B is a diagram depicting an exemplary interior of vehicle including an interior-facing display device that reproduced the scene behind vehicle as captured by camera in real-time to improve the visibility of the driver while displaying messages visible to other nearby motorists and pedestrians according to embodiments of the present invention.

FIG. 3B depicts an exemplary view that is interior of vehicle 300 including an interior-facing display device 305 that reproduced the scene behind vehicle 300 as captured by rear directed camera 310 in real-time to improve the visibility of the driver according to embodiments of the present invention. Interior-facing display device 305 typically fills all or most of the rear window of the vehicle 300, and the unblocked portions of the window can be covered with an opaque material to prevent light from leaking in and potentially distracting the driver or hindering visibility. Camera 310 can be mounted within the frame/bezel of the exterior-facing display device, which is typically disposed behind interior-facing display device 305, or on any portion of vehicle 300 that is relatively high and provides good visibility behind vehicle 300.

Figure 4:
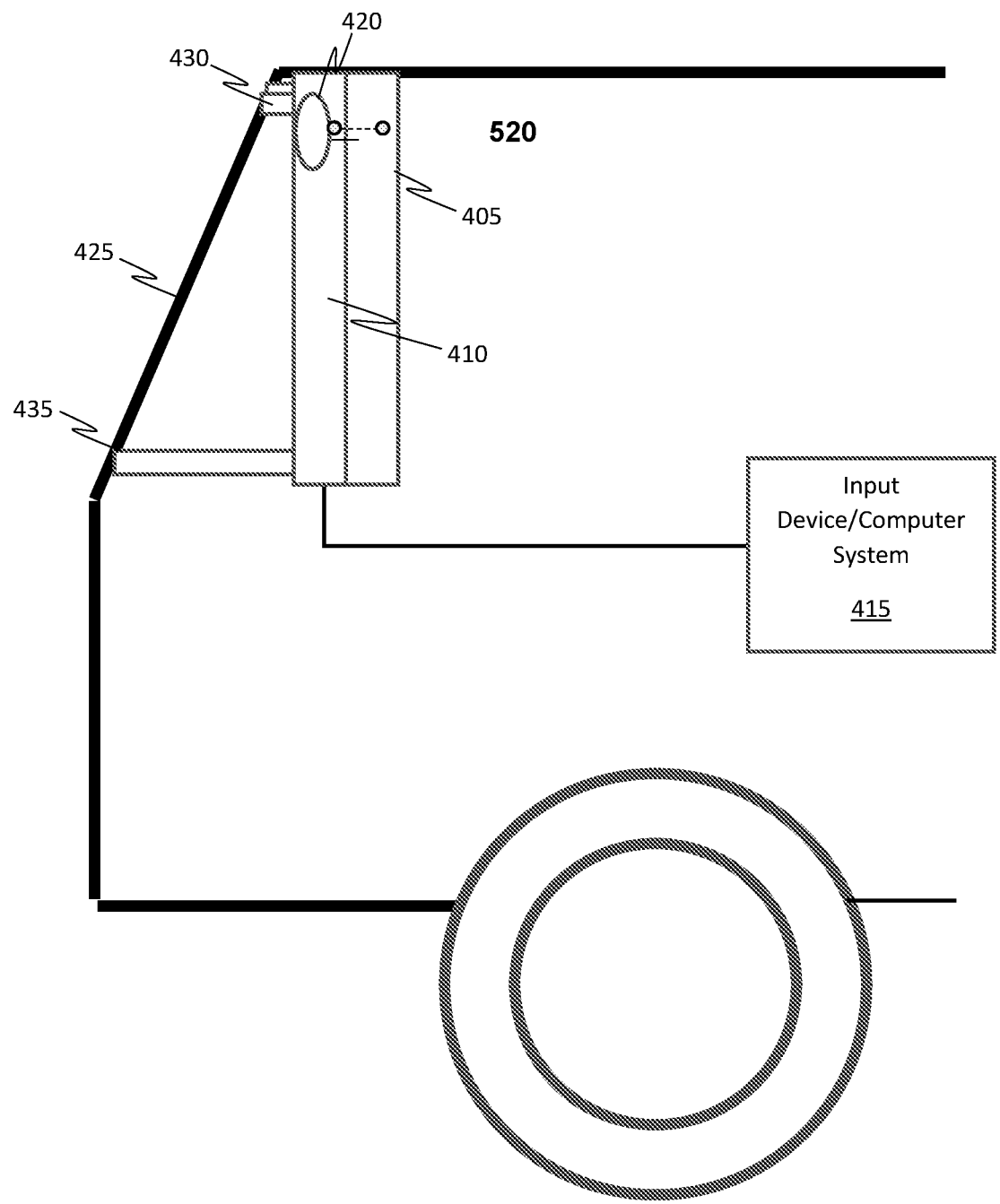
FIG. 4 is a diagram of an exemplary vehicle including interior-facing display device and exterior-facing display device mounted to a sloped rear window or hatch in a substantially perpendicular orientation according to embodiments of the present invention.

FIG. 4 depicts an exemplary side view of vehicle 400 including interior-facing display device 405 and exterior-facing display device 410 mounted to a sloped rear window or hatch 425 in a substantially perpendicular orientation according to embodiments of the present invention. Bottom mount 435 is typically longer than top mount 430 to orient the sandwiched displays in a way that provides good visibility to other drivers, and the orientation can be adjusted by selectively adjusting the length of the mounts 430 and 435. For example, exterior-facing display 410 can be titled downward at a certain angle by increasing the length of top mount 430 or decreasing the length of bottom mount 435. Multiple top mounts 430 and bottom mounts 435 can be used, according to embodiments, depending on the size of the display devices 405 and 410, for example.

Camera 420 captures the scene behind vehicle 400 and passes the captured video to interior-facing display device 405 to enable the driver to visualize the scene behind vehicle 400 in real-time. Input device/computer system 415 can be a simple keyboard, touchpad, laptop, smartphone, etc. that sends data/commands to exterior-facing display device 410 for generating messages to communicate with other motorists.

FIG. 5 is a flowchart depicting exemplary steps of a process 500 for real-time communication with other drivers and driver visibility enhancement according to embodiments of the present invention. At step 505, real-time image data (e.g., a video stream) is captured by a rear-directed camera mounted near the rear of the vehicle. The camera is operable to capture the real-time scene behind the vehicle, including the road and other motorists, and the "rear view" video feed is reproduced on an interior-facing display at step 505. In this way, the driver can communicate with other motorists and pedestrians using an exterior-facing display covering the rear window (behind the interior facing display) without losing the ability to drive safely.

At step 515, input data and/or display commands are received by an input device, computer system, or remote system. The input data and/or display commands can include a string of text input using a touchscreen or keyboard, and/or a selection of a preconfigured message, color, animation, etc., that is stored in a memory of a computer system, or transmitted from the remote system to the vehicle.

At step 520, the input data/display commands are used to render a message on the exterior-facing display device mounted behind the interior-facing display device, which advantageously improves the safety of motorists near the vehicle without blocking the view of the driver. The input data and display commands can also be used to render or mirror the same message on an in-vehicle display device and used by the driver to readily view/preview the message being displayed or to be displayed on the exterior-facing display device. The in-vehicle display device is typically mounted near the driver in the front of the vehicle.

FIGS. 6-10 depict exemplary messages that can be displayed on an exterior-facing display device mounted near the rear of an emergency response or other vehicle according to embodiments of the present invention. The exemplary messages depicted in FIGS. 6-10 can be generated manually using an input device (e.g., keyboard, smartphone, etc.), or can be saved in a memory of a computer system and selected by the user for display, or can be communicated to the vehicle from a remote system.

Figure 6:
FIG. 6 is a diagram depicting an exterior-facing display of vehicle displaying the message: "SLOW FOR ACCIDENT" according to embodiments of the present invention.

In the example of FIG. 6, exterior-facing display 605 of vehicle 600 displays the traffic-calming message: "SLOW FOR ACCIDENT".

Figure 7:
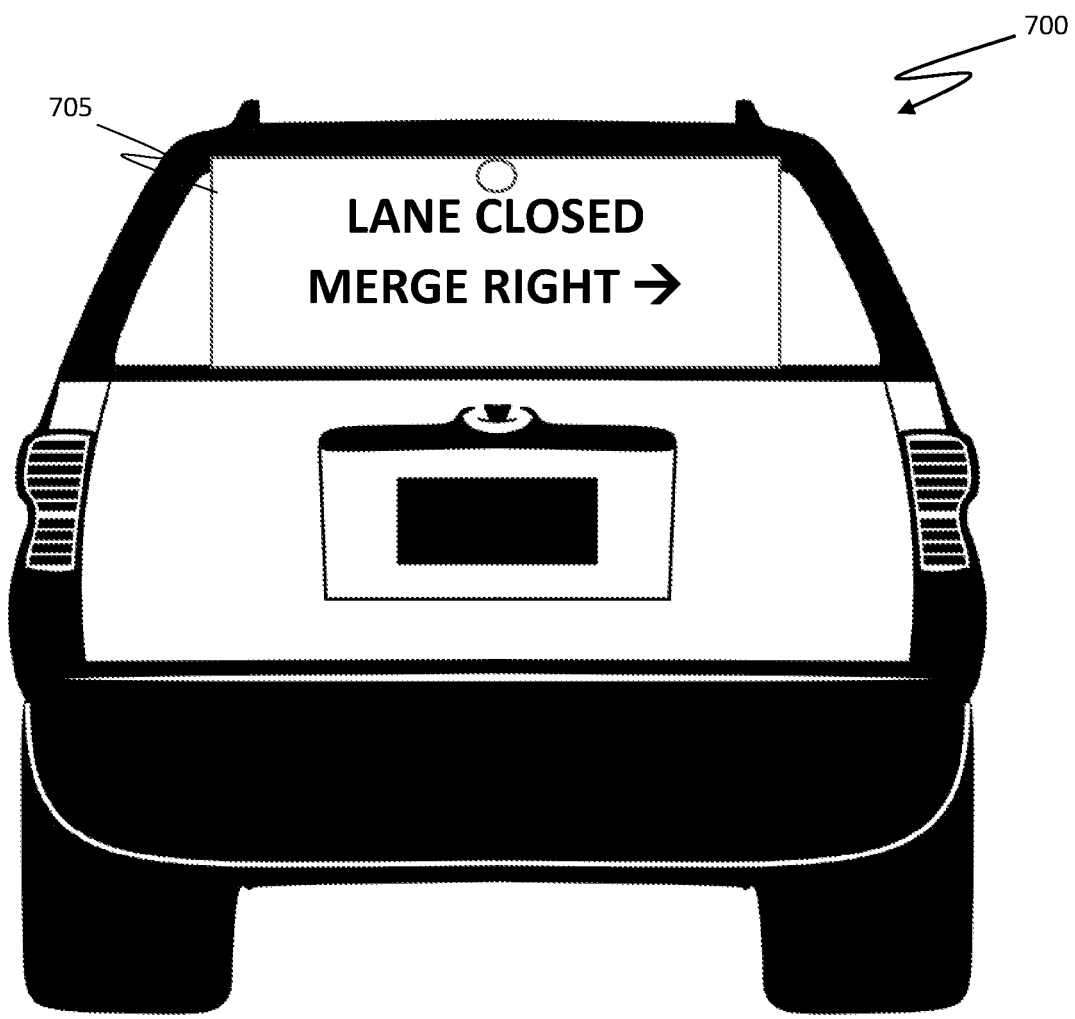
FIG. 7 is a diagram of an exterior-facing display of vehicle displays the message "LANE CLOSED MERGE RIGHT" and includes an arrow indicating the direction to merge according to embodiments of the present invention.

In the example of FIG. 7, exterior-facing display 705 of vehicle 700 displays the traffic directing message "LANE CLOSED MERGE RIGHT" and includes a graphical depicting of an arrow indicating the direction to merge.

Figure 8:
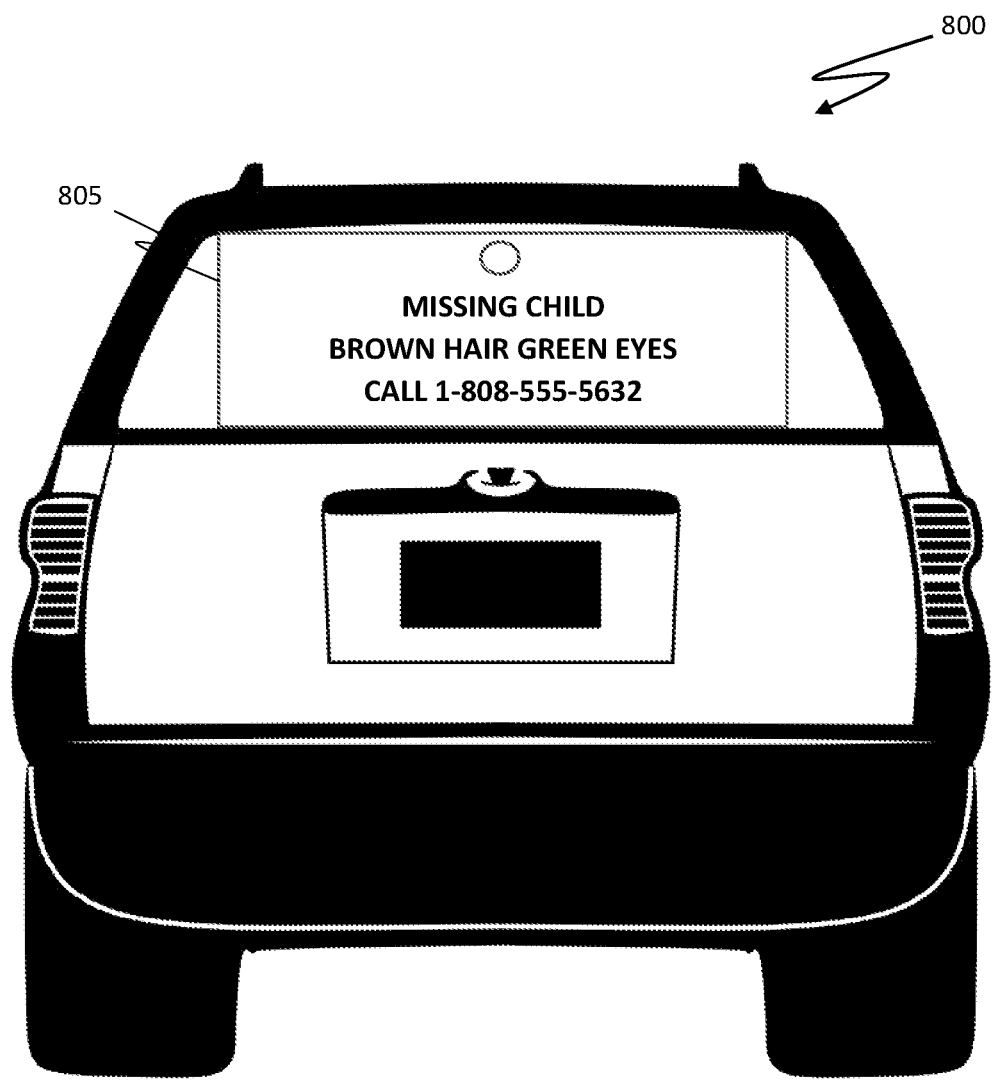
FIG. 8 is a diagram of an exterior-facing display of vehicle displays the message "MISSING CHILD BROWN HAIR GREEN EYES CALL 1-808-555-5632" according to embodiments of the present invention.

In the example of FIG. 8, exterior-facing display 805 of vehicle 800 displays the message "MISSING CHILD BROWN HAIR GREEN EYES CALL 1-808-555-5632."

Figure 9:
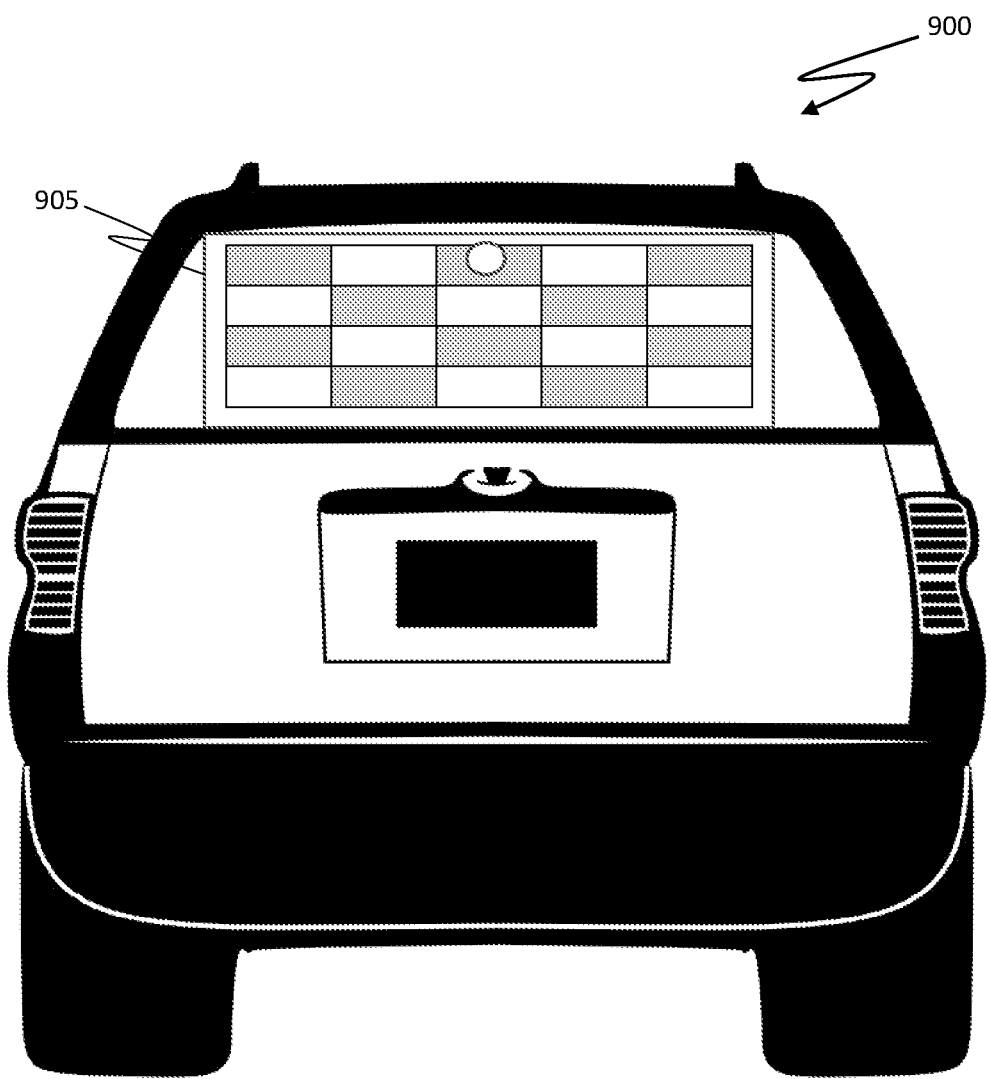
FIG. 9 is a diagram of an exterior-facing display of vehicle displays a flashing light animation according to embodiments of the present invention.

In the example of FIG. 9, exterior-facing display 905 of vehicle 900 displays a flashing light graphical animation. The lights can be of different colors, such as red and blue, to draw the attention of other motorists.

Figure 10:
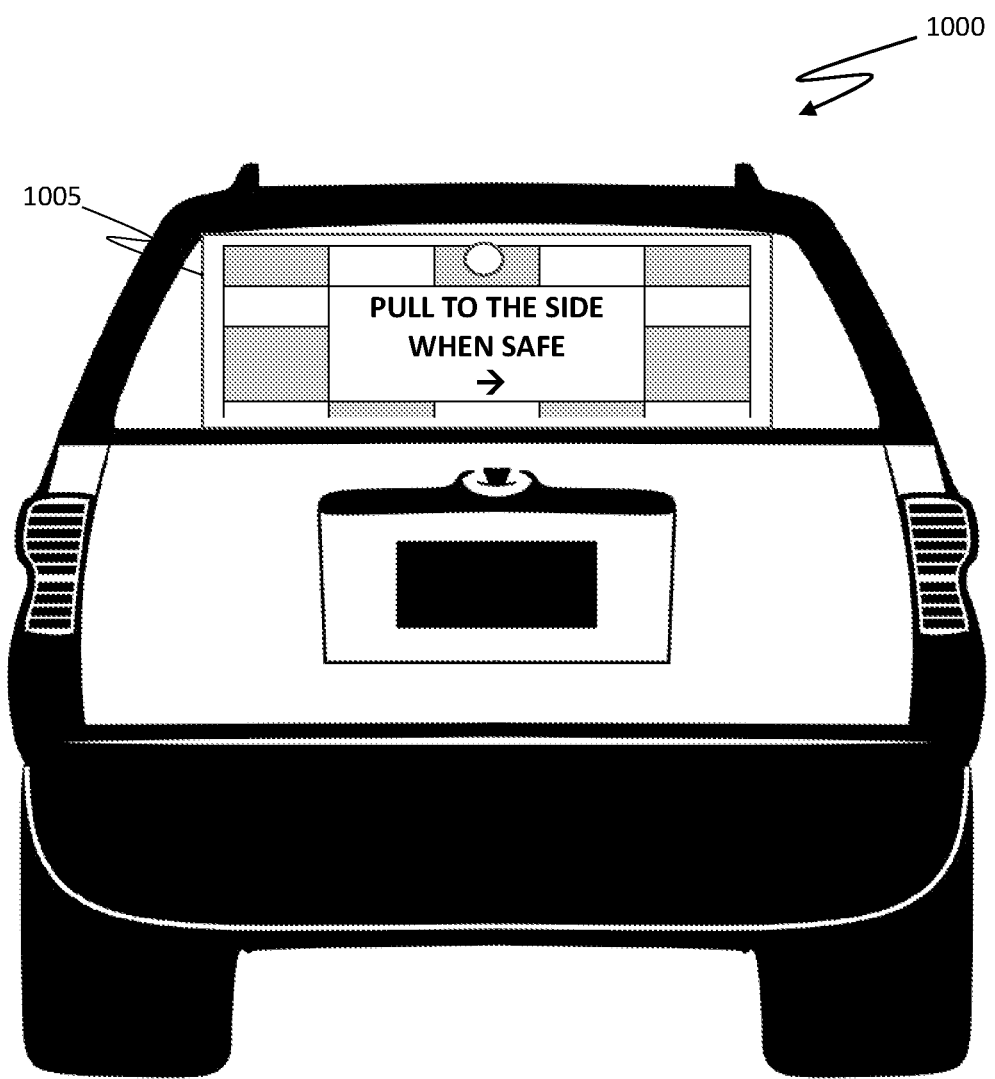
FIG. 10 is a diagram of an exterior-facing display of vehicle displays a flashing light animation and the message "PULL TO THE SIDE WHEN SAFE" with an arrow indicating the direction for the driver to pull over safely according to embodiments of the present invention.

In the example of FIG. 10, exterior-facing display 1005 of vehicle 1000 displays a flashing light graphical animation and the message "PULL TO THE SIDE WHEN SAFE" with an arrow indicating the direction for the driver to pull over safely.

Exemplary Computer System

Embodiments of the present invention are drawn to in-vehicle displays coupled to computer systems for displaying messages to the public (e.g., motorists and pedestrians) using an exterior-facing display system. The following discussion describes such exemplary computer systems which can be used to control the display devices.

Figure 11:
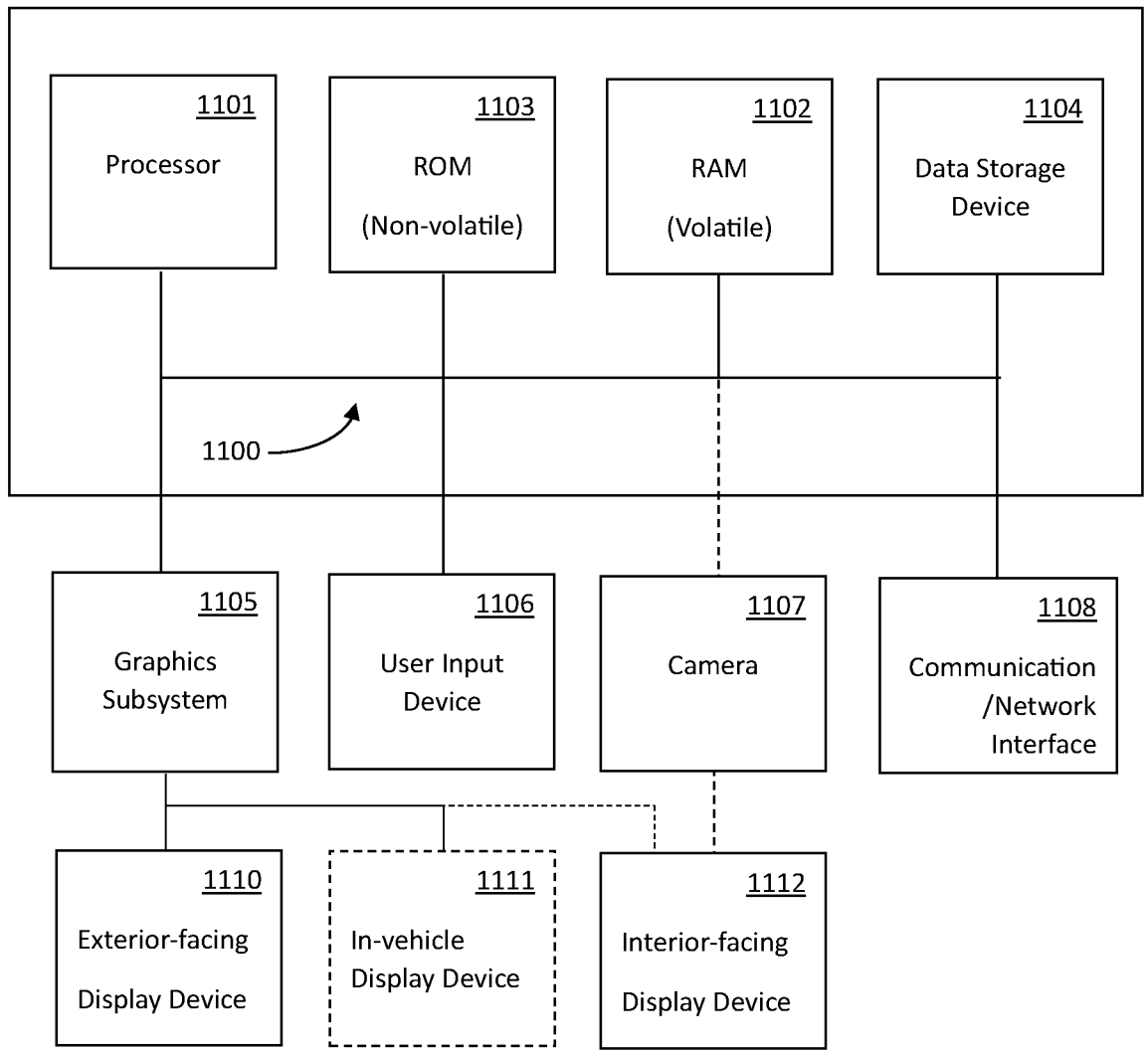
FIG. 11 is a block diagram of an exemplary computer system upon which embodiments of the present invention may be implemented.

In the example of FIG. 11, the exemplary computer system 1113 includes a central processing unit (CPU) 1101 for running software applications (e.g., a workload management application) and optionally an operating system. Random access memory 1102 and read-only memory 1103 store applications and data for use by the CPU 1101. Memories 1102 and 1103 can also store message related data (e.g., text, colors, animations, etc.) for display on exterior-facing display device 1110 as selected by a user. Data storage device 1104 provides non-volatile storage for applications and data and may include fixed disk drives, removable disk drives, flash memory devices, and CD-ROM, DVD-ROM, or other optical storage devices. The user inputs device 1106 may comprise devices that communicate inputs from one or more users to the computer system 1113 (e.g., keyboards, mice, joysticks, cameras, touch screens, and/or microphones), and can receive text and selection input for generating messages to be displayed on exterior-facing display device 1110.

A communication or network interface 1108 allows the computer system 1113 to communicate with other computer systems, networks, or devices via an electronic communications network, including wired and/or wireless communication and including an Intranet or the Internet. The display device 1110 may be any device capable of displaying visual information in response to a signal from the computer system 1113 and may include a flat panel touch sensitive display, for example. The components of the computer system 1113, including the CPU 1101, memory 1102/1103, data storage 1104, user input devices 1106, and graphics subsystem 1105 may be coupled via one or more data buses 1100. According to some embodiments, user input devices 1106 are coupled to computer system 1113 wirelessly using bluetooth or another communication interface 1108.

In the embodiment of FIG. 11, a graphics subsystem 1105 may be coupled with the data bus and the components of the computer system 1113. The graphics system 1105 may comprise a physical graphics processing unit (GPU) and graphics/video memory. GPU may include one or more rasterizers, transformation engines, and geometry engines, and generates pixel data from rendering commands to create output images. Graphics subsystem 1105 can output display data to exterior-facing display device 1110, optional in-vehicle display device 1111, and/or interior-facing display device 1112. Interior-facing display device 1112 can receive a real-time video feed from an output of computer system 1100 (e.g., graphics subsystem 1105 or communication interface 1108) or directly from camera 1107, which is typically mounted near the top of exterior-facing display device 1110. Interface 1108 may include a wireless interface for receiving messages from a remote system.

Embodiments of the present invention are thus described. While the present invention has been described in particular embodiments, it should be appreciated that the present invention should not be construed as limited by such embodiments, but rather construed according to the following claims.

What is claimed is:

1. A dual-sided display device for emergency vehicle communication, the display device comprising:
   a first display panel operable to display public notifications and operable to be disposed adjacent to a rear window of an emergency vehicle wherein said first display panel is operable to display images viewable to traffic behind said emergency vehicle;
   a camera disposed on said first display panel and operable to capture real-time rear-view video of said emergency vehicle; and
   a second display panel, disposed adjacent to said first display panel, and coupled to said camera, said second display panel operable to display said rear-view video viewable to a driver of said emergency vehicle, and wherein said first and second display panels are disposed back-to-back and in parallel with each other.

2. The dual-sided display device as described in claim 1, wherein said second display panel is forward facing and is operable to be viewed from inside said emergency vehicle.

3. The dual-sided display device as described in claim 1, wherein said first display panel is rear-facing.

4. The dual-sided display device as described in claim 1, further comprising an input device operable to receive input comprising at least one of: text input; and message selection input, and wherein the first display panel is operable to display public notifications based on the input.

5. The dual-sided display device as described in claim 1, further comprising:
- a processor; and
- a memory, wherein the memory stores a plurality of messages for display on the first display panel, and wherein the processor is operable to access a selected message of the plurality of messages for display on the first display panel.

6. The dual-sided display device as described in claim 1, further comprising:
- a top mounting element disposed near a top edge of the first display panel; and
- a bottom mounting element disposed near a bottom edge of the first display panel, and wherein the top mounting element and the bottom mounting element are operable to fix the first display panel and the second display panel to an interior surface of the rear window of the emergency vehicle.

7. The dual-sided display device as described in claim 6, wherein the top mounting element and the bottom mounting element are selectively adjustable in length to change an orientation angle of the first display panel and the second display panel.

8. An emergency vehicle display assembly, said assembly comprising:
- a first display panel operable to display public notifications and operable to be disposed adjacent to a rear window of an emergency vehicle wherein, so disposed, said first display panel is operable to display images viewable to traffic behind said emergency vehicle;
- a camera disposed on said first panel and operable to capture real-time rear view scene video of said emergency vehicle;
- a second display panel, disposed adjacent to said first display panel, and coupled to said camera, said second display panel operable to display said rear view scene video;
- a processor coupled to said first display panel and operable to receive information from an input device and operable to generate said public notifications based on said information;
- said input device coupled to said processor and operable to receive input comprising at least one of: text input; and message selection input; and
- mounting elements disposed on said first display panel, said mounting elements operable to secure said first and second display panels within said emergency vehicle and on to said rear window thereof.

9. The display assembly as described in claim 8, wherein said second display panel is forward facing and operable to be viewed from inside said emergency vehicle, and wherein said first display panel is rear-facing.

10. The display assembly as described in claim 8, wherein said first and second display panels are disposed back-to-back and in parallel with each other.

11. The display assembly as described in claim 8, further comprising a memory coupled to the processor, wherein the memory is operable to store a plurality of messages for display on the first display device, wherein the processor is operable to select a first message of the plurality of messages according to said message selection input received by said input device.

12. The display assembly as described in claim 11, wherein the input device is further operable to receive at least one of: color value information; and animation value information, and wherein the processor is further operable to generate said public information according to at least one of: the color value information; and animation value information.

13. A method of displaying public information on a vehicle-mounted display of an emergency vehicle, the method comprising:
- capturing real-time rear-view scene video using a camera mounted near a rear of the vehicle;
- displaying the real-time rear-view scene video on an interior-facing display device mounted to a rear window of the vehicle, wherein the interior-facing display device is visible from the inside of the emergency vehicle;
- receiving message data from a computer system disposed in the vehicle; and
- displaying a public information message on an exterior-facing display device based on the message data, wherein the exterior-facing display device is visible from outside of the emergency vehicle, and wherein the interior-facing display device and the exterior-facing display device are disposed back-to-back and in parallel with each other.

14. The method of claim 13, wherein the interior-facing display device and the exterior-facing display device are mounted adjacent to a rear window of the emergency vehicle.

15. The method of claim 13, wherein the receiving message data from a computer system disposed in said vehicle comprises receiving input data from an input device coupled to the computer system.

16. The method of claim 15, wherein said input data comprises text.

17. The method of claim 15, further comprising receiving, via the input device, at least one of: color value information; and animation value information, and wherein said processor is further operable to generate said public information according to at least one of: said color value information; and said animation value information.

18. The method of claim 15, further comprising storing a plurality of messages for display on said display device in a memory of the computer system, and wherein said displaying a public information message on an exterior-facing display device is based on a message selection input received by said input device that identifies one of the plurality of messages.

19. The method of claim 13, further comprising displaying said public information message on an in-vehicle display.

20. The method of claim 13, wherein said public information message comprises animated text.

* * * * *